United States Patent [19]

Hsu

[11] Patent Number: 4,793,946
[45] Date of Patent: Dec. 27, 1988

[54] THIN PRINT ETCHABLE GOLD CONDUCTOR COMPOSITION

[75] Inventor: King F. Hsu, Wayne, N.J.

[73] Assignee: Engelhard Corporation, Menlo Park, N.J.

[21] Appl. No.: 915,363

[22] Filed: Oct. 6, 1986

[51] Int. Cl.⁴ .......................... H01B 1/02; B32B 3/04
[52] U.S. Cl. .................................. 252/514; 106/1.13; 106/1.18; 101/450.1; 427/125; 427/286
[58] Field of Search .............. 252/514; 106/1.14, 1.13, 106/1.18; 427/125, 286; 101/450.1

[56] References Cited

U.S. PATENT DOCUMENTS

| | | | |
|---|---|---|---|
| 3,935,366 | 1/1976 | Smith | 106/1.14 |
| 4,230,493 | 10/1980 | Telten | 252/514 |
| 4,235,944 | 11/1980 | Telten | 106/1.14 |
| 4,466,830 | 8/1984 | Rellick | 252/514 |
| 4,468,251 | 8/1984 | Hausselt et al. | 106/1.14 |

*Primary Examiner*—Josephine Barr

[57] ABSTRACT

A thin print etchable gold conductor composition for use in metallizing surfaces of substrates, particularly those used in the construction of miniaturized high density circuits is disclosed. The composition is formulated in such a manner so that it is capable of being printed onto a surface of a substrate as a very thin film.

14 Claims, 1 Drawing Sheet

GOLD WIRE BONDABILITY OF EXPERIMENTAL GOLD ON 96% ALUMINA

GOLD WIRE BONDABILITY OF EXPERIMENTAL
GOLD ON 96% ALUMINA

GOLD WIRE BONDABILITY OF EXPERIMENTAL
GOLD ON GLAZED ALUMINA SUBSTRATE (NTK)

THIN PRINT ETCHABLE GOLD CONDUCTOR COMPOSITION

BACKGROUND OF THE INVENTION

1. Field of the Invention

The present invention relates to a thin print etchable gold conductor composition which may be used as a substitute for either the thick film or thin film techniques for metallizing surfaces wherein a thin film is necessary. The composition has particular application in the production of metallized substrates used to construct miniaturized high density circuits.

2. Description of the Prior Art

In conventional thick film technology, the thickness of metallized deposits on a substrate or other surface is controlled primarily by screen and emulsion dimensions and to a lesser extent by the printing equipment parameters. Most of the cermet precious metal conductor fired films are controlled or calibrated at 12.5 microns thick, some base metal conductors and cured PTF films are usually made thicker. In certain special applications, such as buried electrode gold conductors for multilayer use, a deposit of only about 7 microns is required in order to control the flatness of the surface for ease of subsequent printing.

To permit high resolution etching and to reduce cost by reducing the amount of gold used for printing, even thinner films are desired. The necessary thickness cannot be achieved through control of normal printing variables, nor will simply dilution of conventional pastes yield the necessary result. Using thick film printing techniques, 10 mil lines and 10 mil spaces are routine in production runs, the dimensions referring to the width of the lines. With more care, it is possible to print 5 mil lines in the production environment. Further reduction of line width is not possible with today's thick film printing techniques. Moreover, it is not possible to print such lines to a thickness of less than about 7 microns using thick film printing techniques. Even if fairly thin lines could be printed using some modified thick film printing techniques, because of the consistency and density of the pastes used in thick film printing voids would be present in the metallized layer resulting in unacceptable conductivity properties.

Thus, since conventional thick film printing techniques cannot be employed to achieve 1 or 2 mil lines, thin print etchable gold compositions are the only alternative, they can be used to print relatively fine lines to less than about 7 microns in thickness, followed by thin film lithographics patterning techniques to etch the gold film to less than 2 mil lines. The major disadvantage is that thin film processing is very costly because of the initial cost of equipment and operations.

SUMMARY OF THE INVENTION

The thin print etchable gold composition of the present invention combines both thick film processing techniques and the photo lithographic pattering techniques used in thin film processing.

The composition of the present invention generally comprises a gold material comprising a mixture of gold spherical powders and flakes, a binder such as a glass frit transition metal oxides and an organic vehicle. The flakes of the gold material act to enhance the conductivity of the composition and to make it denser. As a result, the composition when printed on a surface of a substrate in a thin layer of about 3-6 microns has very few voids and thus, exhibits excellent conductivity and wire bondability.

In addition, the composition of the present invention when printed can be etched to produce fine lines of a width of about 2 mils with 1 mil spaces between the lines. While conventional thick films can also be etched to such narrow lines with special etching techniques, because of the thickness and long etching time, severe undercutting and loss of adhesion are observed. If conventional thick film materials are diluted to produce a thinner film, larger voids result, thereby preventing etching to very fine lines. Thus, the composition of the present invention allows for very rapid etching, a minimum of undercutting and adhesion loss and freedom from large voids resulting in excellent conductivity and wire bondability.

DESCRIPTION OF THE PREFERRED EMBODIMENT

Figure 1:
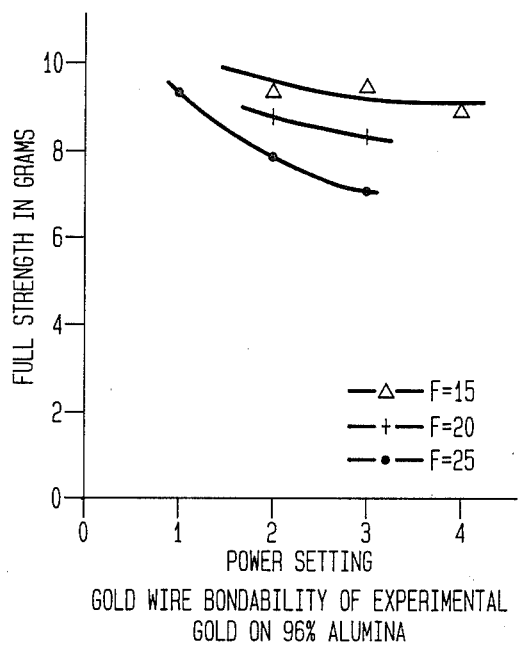

According to the present invention, the thin film etchable gold composition comprises a gold material containing a mixture of spherical gold powders and gold flakes, a binder such as a glass frit transition metal oxides and an organic vehicle.

The gold material comprises a gold powder composed substantially of submicron particles generally spherical in shape having an average particle size of from about 0.1 to 0.9 microns, more preferably about 0.2 to 0.9 microns, and most preferably about 0.3 to 0.8 microns. Any suitable gold powder having such an average particle size may be employed. The other component of the gold material is a gold flake. The gold flake has a particle size of no more than 3 microns in length, preferably about 1 to 2 microns in length, it being understood that larger or smaller particles may be present. Generally, the gold material comprises 50 to 95% gold powder and 50 to 5% gold flake, more preferably 75 to 90% gold powder and 25 to 10% gold flake. The gold material may be manufactured by mixing gold powder and flakes together or by coprecipitating the gold so that it contains both gold powder and flakes. The coprecipitated material is presently preferred. It is also presently preferred to employ a gold material wherein 95% of the particles are less than about 2-4 microns in diameter, 90% are less than about 1.8-3.0 microns in diameter, 50% are less than about 1.2-2.1 microns in diameter and 10% are less than about 0.7-1.4 microns in diameter. The average surface area of the particles is generally about 0.4 to 0.8 $m^2/g$ and, more preferably, about 0.54 to 0.7 $m^2/g$. The tap density of the gold material is of from about 4.0 to 8.0 $g/cm^3$ and, more preferably, about 5.0 to 7.2 $g/cm^3$. The gold material is generally present in the composition in an amount of about 70-95% or by weight, most preferably 75 to 90% by weight and most preferably 80 to 90% by weight.

The binder may be any one of those binders that are generally used in thick film gold compositions so long as it produces a substantially dense gold paste. The binder compositions generally include at least one metal oxide powders such as a finely divided copper oxides, cadmium oxides, zin oxides, nickel oxides and bismuth oxides and glass frit binders. It is, however, presently preferred to employ a glass frit comprising lead borosilicate containing trace amounts of zinc oxide, bismuth oxide, cadmium oxide and copper oxide. It is also preferred to employ a frit wherein 95% of the particles are less than about 1.7-3.0 microns in diameter, 90% are less than about 1.5-2.5 microns in diameter, 50% are less than about 0.7-1.2 microns in diameter and 10% are less than about 0.2-0.45 microns in diameter. Generally the surface area of such particles in the frit are of from about 2-5 $m^2/g$, and, more preferably, 3-4 $m^2/g$. It is presently preferred to use the frit in the form of a paste containing both the frit powder modifiers and a suitable organic medium, which medium is compatible with the medium used in the overall composition.

The organic vehicle useful in the present invention comprises any suitable organic vehicle normally used in conventional thick film gold compositions so long as it produces a relatively dense paste. For example, the organic vehicle may include solutions or dispersions of resins such as ethyl cellulose resin, Staybellite resin manufactured by Hercules and polybutylmethacrylate. Suitable solvents or dispersion mediums must be physically compatible with the resin and the resulting solution or dispersion must be chemically inert with respect to the other components of the gold conductor composition. Suitable organic liquids include aliphatic alcohols, esters of such alcohols, glycol ethers, terpines, and di-alkylphthalates. The organic vehicle is generally present in an amount of about 2.5 to 30% by weight and, more preferably, in an amount of about 10-20% by weight.

To improve the adhesion properties of the composition, a fluxing composition may also be added. The fluxing composition may include various base metal resinates such as resinates of bismuth, cadmium, vanadium, copper and a film forming resinate such as rhodium. Specific examples of such resinates are copper ethylhexanoate, cadmium 2-ethylhexoate, bismuth neodecanoate, vanadium 2-ethylhexanoate, and rhodium 2-ethylhexanoate. An organic material such as a resin or solvent may also be included. The fluxing composition is generally present in an amount of from about 0.5 to 5.0% by weight and, more preferably, in an amount of about 1.0 to 3.0% by weight.

The following examples further illustrate the present invention.

EXAMPLE 1

A thin print etchable gold conductor composition was prepared by mixing together the following components: a gold powder/flake material Engelhard A4953, a frit paste comprising a lead borosilicate glass with trace amounts of aluminum trioxide, bismuth trioxide, cadmium oxide, copper oxide and zinc oxide. The frit paste also contained an organic vehicle comprising 40% by weight terpineol 318 manufactured by Hercules, 30% by weight butyl carbitol acetate, 5% by weight cetyl alcohol, 10% by weight Staybellite resin manufactured by Hercules and 15% by weight ethyl cellulose N22 manufactured to Hercules. To the gold material and frit paste were added a resinate flux containing 36.5% cadmium 2-ethylhexoate, 45.5% bismuth neodecanoate, 3.0% by weight rhodium-2-ethylhexoate, 5% by weight dibutylphthalate and 10% by weight Thixcin R manufactured by NL Chemicals. To that mixture was added an organic vehicle (vehicle A) comprising 15.4% by weight staybellite resin, 35.1% butyl carbitol, 35.1% terpineol 318 and 14.4% ethyl cellulose. Then, a different organic vehicle (vehicle B) comprising the same components and in the same proportions as recited in the frit paste material disclosed above was added in an amount of 7.66% by weight. Finally, bismuth neodecanoate was added to the composition. The percentages of each of the components added was as follows: 81% gold material, 1.15% frit paste, 1.84% resinate flux, 7.2% vehicle A, 7.66% vehicle B, and 1.15% bismuth neodecanoate. The resulting mixture was then placed on a three roll mill and formed into a paste suitable for printing onto a surface.

The composition of Example 1 was then tested for its gold wire bond properties. Thus, it was printed on both a 96% alumina substrate (Kyocera) and a NTK glazed alumina substrate (NTK Technical Ceramic Division, NGK Spark Plug Company, Ltd. part No. SBG-062WB-2).

A 1"×1" test pattern on a 5"×5" frame with a 400 mesh stainless steel screen with a 0.5 mil thick emulsion was used. The paste was printed, allowed to level for ten minutes at room temperature and dried for 10 minutes in a 125° C. oven. Then, the parts were fired at 830° C. for 10 minutes with a total cycle time of 36 minutes. Samples were all fired one more time to simulate a typical manufacturing process and to ensure the compatibility of the gold film and substrate materials.

A Kullicke and Soffa Wedge Bonder, Model 4123 was used to conduct thermosonic bondigg tests. Throughout the tests, the stage temperature was maintained at 150° C. and the Gold Wire Bonding Wedge (Model 428-7-TiC) and a 25 micron gold wire (Be doped) was used. The pull test was carried out using a Unitek Micropull III pull tester. Approximately, 35 wires were pulled for each data point in Table I below.

The tests of wire bondability under different power settings indicate that the gold bond strengths on 96% alumina substrates is to some degree dependent on static force on the wedge. The dependency on power settings at forces of 25 g. or higher is very pronounced. As the force decreases below 20 g., bond strength is sensitive to the power setting. The results are shown in FIG. 1.

Figure 2:
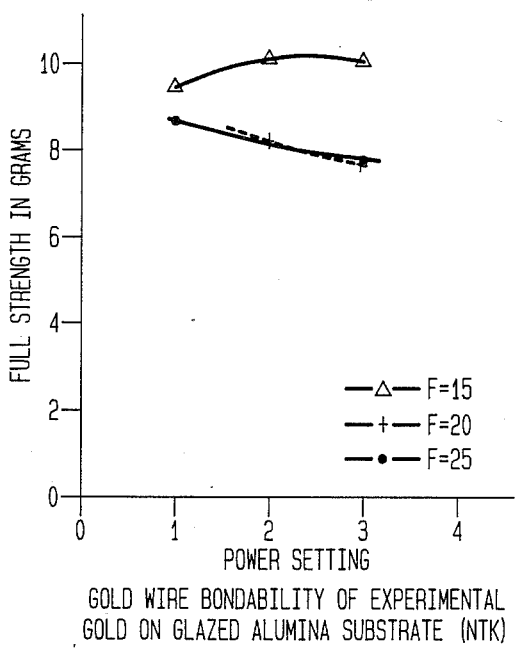

On NTK glazed substrates, bond strengths are sensitive to forces of 20 g. and up. Near 15 g., the bonds strengths were less sensitive to the power setting. The results are plotted in FIG. 2.

In addition to the above tests, thermal aging tests were conducted at 150° C. and readings were taken at initial 500 hours and 1000 hours and the gold wire bond strengths are reported in Table I below:

TABLE I

| Gold Wire Bond Data (in grams) | | |
|---|---|---|
| | 96% Alumina | NTK Glazed Alumina |
| Initial | 7.2 | 7.9 |
| 500 hours | 7.3 | 6.3 |
| 1000 hours | 7.9 | 7.9 |

An adherence test of the gold conductor to the substrate was also carried out using the pull tests employing the Sebastian method (Sebastian I Adherence Tester). The adhesion on a 96% alumina substrate exceeded 5660 psi and all failures occurred within the epoxy joint instead of the interface of the gold and the substrate. Based on these test results, the adherence of the gold to the substrate is considered excellent.

With film thickness normalize to 10 microns in the conventional manner, sheet resistivity of less than 4.5 milliohms/square are consistently observed.

The composition of the present invention is capable of being directly printed to produce 5 mil lines and spaces. However, further reduction to 2 mil lines with 1 mil spaces is readily attainable using lithographic patterning techniques followed by an etching process. The thin print gold conductor composition is capable of being printed to thicknesses of from about 3 to 6 microns. As the film gets thinner, the surface roughness of the substrates become more of a factor. As a result, the metal film surface becomes rough and the quality of the gold wire bonds suffer to some extent. Since the surface of glazed alumina substrates is very smooth, the gold film deposited is also much smoother than its counterpart on a 96% alumina substrate. Thus, it is preferred to use a very smooth substrate such as a glazed alumina substrate or a polished alumina substrate to obtain the best results when employing the thin print etchable gold composition of the present invention to produce fine lines which are relatively thin in thickness.

We claim:

1. A gold conductor composition for use in printing thin films on a substrate comprising a gold material containing about 50–95 percent by weight gold powder and about 50–5 percent gold by weight flakes, the gold powder having a particle size of about 0.1 to 0.9 microns and the gold flakes having a particle size of no more than about 3.0 microns, a binder and an organic vehicle, the gold material being present in an amount of about 70 to 95 percent by weight of the composition.

2. The gold conductor composition of claim 1, wherein the gold material comprises 80 to 95% by weight of the composition.

3. A process for printing a gold material on a substrate comprising printing the gold conductor composition of claim 1 on a substrate to a thickness of no more than about 6 microns.

4. The composition of claim 1, wherein the binder contains at least one of cadmium oxide, bismuth oxide and rhodium oxide.

5. The composition of claim 1, wherein the gold material comprises about 75 to 90 percent gold powder and about 25–10 percent gold flake.

6. The composition of claim 2, wherein the binder and organic vehicle are present in the form of a paste.

7. The composition of claim 1, wherein the gold material comprises particles wherein about 95 percent of the particles are less than about 2–4 microns in diamemter, about 90 percent of the particles are less than about 1.8–3.0 microns in diameter, 50 percent are less than about 1.2–2.1 microns in diameter and 10 percent are less than about 0.7–1.4 microns in diameter.

8. The composition of claim 1, wherein the tap density of the gold material is from about 4.0 to 8.0 g/cm$^3$.

9. The composition of claim 1, wherein the composition additionally contains a fluxing material.

10. The composition of claim 9, wherein the fluxing material comprises a resinate selected from the group consisting of copper ethylhexanoate, cadmium 2-ethylhexoate, bismuth neodecanoate, vanadium 2-ethylhexanoate and rhodium 2-ethylhexanoate.

11. The process of claim 3, wherein the printing is screen printing.

12. A process for printing a gold material on a substrate comprising printing the gold conductor composition of claim 5 on a substrate to a thickness of no more than about 6 microns.

13. A process for printing a gold material on a substrate comprising printing gold conductor composition of claim 6, on a substrate to a thickness of not more than about 6 microns.

14. A process for printing a gold material on a substrate comprising printing the gold conductor composition of claim 9, on a substrate to a thickness of no more than about 6 microns.

* * * * *